(12) United States Patent
Geusic et al.

(10) Patent No.: US 6,198,168 B1
(45) Date of Patent: Mar. 6, 2001

(54) INTEGRATED CIRCUITS USING HIGH ASPECT RATIO VIAS THROUGH A SEMICONDUCTOR WAFER AND METHOD FOR FORMING SAME

(75) Inventors: Joseph E. Geusic, Berkeley Heights, NJ (US); Kie Y. Ahn, Chappaqua, NY (US); Leonard Forbes, Corvallis, OR (US)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 09/009,791

(22) Filed: Jan. 20, 1998

(51) Int. Cl.⁷ .................................................. H01L 23/48
(52) U.S. Cl. .......................... 257/774; 257/676; 257/735; 257/773; 257/774; 438/416
(58) Field of Search ....................... 257/676, 735, 257/774, 773; 438/411

(56) References Cited

U.S. PATENT DOCUMENTS

| | | | |
|---|---|---|---|
| 3,968,564 | 7/1976 | Springhorpe | 29/580 |
| 4,920,070 * | 4/1990 | Mukai | 437/173 |
| 4,970,578 * | 11/1990 | Tong et al. | 357/81 |
| 5,128,831 | 7/1992 | Fox, III et al. | |
| 5,352,998 * | 10/1994 | Tanino | 333/247 |
| 5,409,563 | 4/1995 | Cathey | 156/643 |
| 5,532,506 * | 7/1996 | Tseng | 257/276 |
| 5,604,835 | 2/1997 | Nakamura et al. | 385/129 |
| 5,641,545 | 6/1997 | Sandhu | 427/573 |
| 5,682,062 * | 10/1997 | Gaul | 257/686 |
| 5,742,100 * | 4/1998 | Schoeder et al. | 257/778 |
| 5,834,849 * | 11/1998 | Lane | 257/786 |
| 5,844,289 | 12/1998 | Teranishi et al. | 257/432 |
| 5,900,674 * | 5/1999 | Wojnarowski et al. | 257/774 |
| 5,901,050 * | 5/1999 | Imai | 361/820 |
| 5,903,045 * | 5/1999 | Bertin et al. | 257/621 |
| 5,952,665 | 9/1999 | Bhargava | 250/483.1 |

FOREIGN PATENT DOCUMENTS

| | | | |
|---|---|---|---|
| 03-013907 | 1/1991 | (JP) | G02B/6/12 |
| 404263462 * | 9/1992 | (JP) | 257/774 |
| 405145060 * | 6/1993 | (JP) | 257/774 |
| 91/11833 * | 8/1991 | (WO) | 257/774 |
| 094005039 * | 3/1994 | (WO) | 257/774 |

OTHER PUBLICATIONS

Forbes, L., et al., "Resonant Forward–Biased Guard–Ring Diodes for Suppression of Substrate Noise in Mixed–Mode CMOS Circuits", *Electronics Letters, 31*, 720–721, (Apr. 1995).

Foster, R., et al., "High Rate Low–Temperature Selective Tungsten", *In: Tungsten and Other Refactory Metals for VLSI Applications III*, V.A. Wells, ed., Materials Res. Soc., Pittsburg, PA, 69–72, (1988).

Gong, S., et al., "Techniques for Redaing Switching Noise in High Speed Digital Systems", *Proceedings of the 8th Annual IEEE International ASIC Conference and Exhibit*, 21–24, (1995).

Heavens, O., *Optical Properties of Thin Solid Films*, Dover Pubs. Inc., New York, 167, (1965).

(List continued on next page.)

*Primary Examiner*—David Hardy
*Assistant Examiner*—Edgardo Ortiz
(74) *Attorney, Agent, or Firm*—Schwegman, Lundberg, Woessner & Kluth, P.A.

(57) ABSTRACT

An integrated circuit and method for forming the same. The integrated circuit includes a semiconductor wafer with first and second surfaces. A functional circuit is formed on the first surface of the semiconductor wafer. Further, a metallization layer is formed outwardly from the first surface of the semiconductor wafer. The integrated circuit also includes at least one high aspect ratio via that extends through the layer of semiconductor material. This via provides a connection between a lead and the functional circuit.

26 Claims, 3 Drawing Sheets

OTHER PUBLICATIONS

Horie, H., et al., "Novel High Aspect Ratio Aluminium Plug for Logic/DRAM LSI's Using Polysillicon–Aluminium Substitute", *Technical Digest: IEEE Int. Electron Devices Meeting*, San Francisco, CA, 946–948, (1996).

Kim, Y.S., et al., "A Study on Pyrolysis DMEAA for Selective Deposition of Aluminium", *In: Advanced Metallization and Interconnect Systems for ULSI Applications in 1995*, R.C. Ellwanger, et al., (eds.), Materials Research Society, Pittsburg, PA, 675–680, (1996).

Klaus, et al., "Atomic Layer Controlled Growth of SiO2 Films Using Binary Reaction Sequence Chemistry", *Applied Physics Lett. 70(9)*, 1092–94, (Mar. 3, 1997).

Lehmann, et al., "A Novel Capacitor Technology Based on Porous Silicon", *Thin Solid Films 276, Elsevier Science*, 138–42, (1996).

Lehmann, V., "The Physics of Macropore Formation in Loa Doped n–Type Silicon", *J. Electrochem. Soc., 140*, 2836–2843, (Oct. 1993).

Masu, K. et al., "Multilevel Based Metaalization on AA CVD", 1996 IEEE Symposium, on VLSI Technology, Digest of Technical Papers, Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technoogy—Part B, 19*, 461–472, (Aug. 1996).

Muller, K., et al., "Trench Storage Node Technology for Gigabit DRAM Generations", *Digest IEEE Int. Electron Device Meeting*, San Francisco, CA, 594–597, (Dec. 1996).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T, et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Ott, A.W., et al., "Al303 Thin Film Growth on Si(100) Using Binary Reaction Sequence Chemistry", *Thin Solid Films, vol. 292*, 135–44, (1997).

Senthinathan, R., et al., "Reference Plane Parasitics Modeling and Their Contribution to the Power and Ground Path "Effective" Inductance as Seen by the Output Drivers", IEEE Transactions on Microwave Theory and Techniques, 42, 1765–1773, (Sep. 1994).

Stanisic, B.R., et al., "Addressing Noise Decoupling in Mixed–Signal IC's: Power Distributuon Design and Cell Customization", *IEEE Journal of Solid–State Circuits, 30*, 321–236, (Mar. 1995).

Suntola, T., "Atomic Layer Epitaxy", *Handbook of Crystal Growth 3, Thin Films of Epitaxy, Part B: Growth Mechanics and Dyamics, Elsevier, Amsterdam*, 601–63, (1994).

Sze, S.M., *VLSI Technology*, 2nd Edition, Mc Graw–Hill, NY, 90, (1988).*

Vittal, A., et al., "Clock Skew Optimization for Ground Bounce Control", 1996 IEEE/ACM International Conference on Computer–Aided Design, Digest of Technical papers, San Jose, CA, 395–399, (Nov. 10–14, 1996).*

Wooley, et al., "Experimental Results and Modeling Techniques for Substrate Noise in Mixed Signal Integrated Circuits", *IEEE Journal of Solid State Circuits, vol. SC–28*, 420–30, (1993).*

* cited by examiner

INTEGRATED CIRCUITS USING HIGH ASPECT RATIO VIAS THROUGH A SEMICONDUCTOR WAFER AND METHOD FOR FORMING SAME

TECHNICAL FIELD OF THE INVENTION

The present invention relates generally to the field of integrated circuits and, in particular, to integrated circuits using high aspect ratio vias through a semiconductor wafer and method for forming same.

BACKGROUND OF THE INVENTION

Integrated circuits are used in a wide range of applications. Integrated circuits are conventionally formed on a wafer of semiconductor material. In order to function properly, the integrated circuit uses various electronic signals that are generated or provided from a source that is external to the integrated circuit, e.g., timing or "clock" signals, and power supply signals.

To connect to these signals, the integrated circuit includes a number of bond pads that are typically formed on the surface of the integrated circuit. The bond pads are coupled to nodes of the integrated circuit that need to receive the specified signals. Further, the bond pads are coupled to the external sources by leads. The leads are connected to the bond pads through bond wires. Conventionally, the bond wires have an arc-like shape that extends outwardly from the surface of the semiconductor substrate. The size, shape and length of these bond wires can hamper the operation of some integrated circuits due to the high resistance and high self inductance of the bond wires.

Mixed mode circuits are one type of circuit that can benefit from low impedance connections between bond pads and leads. A mixed mode circuit is a circuit that includes both an analog circuit and a digital circuit that are formed on the same semiconductor wafer. The mixed mode circuits can benefit from low impedance connections to a ground bus and a guard ring to suppress noise in the analog circuits that is caused by the high speed switching of the digital circuits. Such mixed mode circuits are now being used in microprocessors, memory devices, and other integrated circuits.

High inductance or high impedance connections between bond pads and leads can also introduce noise into the power distribution system of an integrated circuit. For example, high speed synchronous digital circuits require large switching currents. The large switching currents can introduce noise into the power distribution system of the digital circuit when the inductance or impedance of the connections to the power supply and ground busses is too high.

Similarly, circuits that include output drivers with large transient currents also can benefit from low resistance and low inductance connections to various power supply, ground, clock and guard ring busses.

For the reasons stated above, and for other reasons stated below which will become apparent to those skilled in the art upon reading and understanding the present specification, there is a need in the art for low impedance, low inductance contacts or connections to power supply, ground, clock, or guard ring buses in integrated circuits.

SUMMARY OF THE INVENTION

The above mentioned problems with integrated circuits and other problems are addressed by the present invention and will be understood by reading and studying the following specification. Integrated circuits are described which use high aspect ratio vias through a substrate that are filled with a conductive material using a substitution technique so as to create low impedance, low inductance connections between various busses and selected leads. Advantageously, such high aspect ratio vias can be used to reduce problems such as ground bounce, substrate bounce, power supply noise, simultaneous switching noise, and cross talk between analog and digital circuits in mixed mode circuit by allowing the signals to be distributed on the back side of the substrate, away from the components of the integrated circuit.

In particular, an illustrative embodiment of the present invention includes an integrated circuit and a method for forming the same. The integrated circuit includes a semiconductor wafer with first and second surfaces. A functional circuit is formed on the first surface of the semiconductor wafer. Further, a metallization layer is formed outwardly from the first surface of the semiconductor wafer. The integrated circuit also includes at least one high aspect ratio via that extends through the layer of semiconductor material. This via provides a connection between a lead and the functional circuit.

In another embodiment, a method for forming an integrated circuit is provided. The method includes forming a functional circuit in a first surface of a semiconductor wafer. At least one high aspect ratio hole is formed through the semiconductor wafer from the first surface to a second, opposite surface. The at least one high aspect ratio hole is filled with polycrystalline semiconductor material and a layer of conductive material is deposited on the first and second surfaces of the semiconductor wafer. The semiconductor wafer is annealed such that the conductive material replaces the polycrystalline semiconductor material to form low resistance and low inductance conductors in the at least one high aspect ratio hole. At least one contact pad is formed on the second surface of the semiconductor wafer so as to provide a contact for the conductors in the at least one high aspect ratio hole.

In another embodiment, an integrated circuit is provided. The integrated circuit includes a semiconductor wafer. A functional circuit is formed in one surface of the semiconductor wafer. A number of high aspect ratio vias are formed through the thickness of the semiconductor wafer. A first end of each high aspect ratio via is coupled to a metallization layer on the first surface of the wafer. A second end of the high aspect ratio via is coupled to a bond pad on a second, opposite side of the semiconductor wafer. The integrated circuit also includes a chip carrier. The chip carrier has leads disposed on a surface of the chip carrier that are coupled to selected of the bond pads on the second surface of the semiconductor wafer when the semiconductor wafer is disposed on the chip carrier.

In another embodiment, a method for forming an integrated circuit is provided. The method includes forming a functional circuit in a first surface of a semiconductor wafer. A number of etch pits are formed in the first surface of the semiconductor wafer at selected locations in the functional circuit. An anodic etch of the semiconductor wafer is performed such that high aspect ratio holes are formed through the semiconductor wafer from the first surface to a second, opposite surface at the location of the etch pits. An insulating layer is formed on an inner surface of each high aspect ratio hole. The high aspect ratio holes are filled with polysilicon. A layer of aluminum is sputter deposited on the first and second surfaces of the semiconductor wafer and the semiconductor wafer is annealed at a temperature of approximately 500 degrees Celsius. The aluminum replaces the polysilicon to form conductors in the high aspect ratio holes. A number of contact pads are formed on the second surface of the semiconductor wafer so as to provide contacts for the conductors in the high aspect ratio holes.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1:
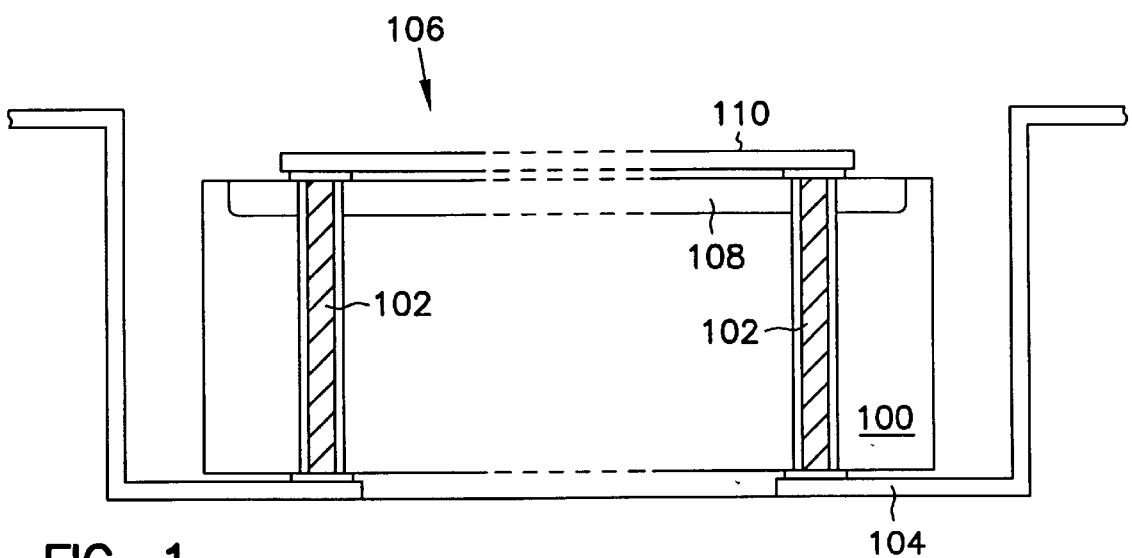
FIG. 1 is an elevational view of an embodiment of a semiconductor wafer having high aspect ratio vias and disposed on a chip carrier according to the teachings of the present invention.

FIG. 1 is an elevational view of an embodiment of the present invention. The embodiment includes semiconductor wafer 100. Semiconductor wafer 100 includes high aspect ratio vias 102 that provide low resistance, low inductance connections to leads 104 in chip carrier 106. High aspect ratio vias 102 have an aspect ratio in the range of approximately 100 to 200. Conventionally, a semiconductor wafer used to form an integrated circuit has a thickness in the range of approximately 500 to 1000 microns. Thus, the high aspect ratio vias can be fabricated with a width that is in the range from approximately 2.5 microns up to as much as approximately 10 microns.

Leads 104 may be coupled to provide, for example, a ground bus, a guard bus, a power supply bus, clock signals, or other appropriate signals to functional circuit 108 in semiconductor wafer 100. High aspect ratio vias 102 advantageously reduce the effect of problems such as ground bounce, substrate bounce, switching noise and power supply noise by providing low impedance and low inductance connections as compared with the much longer, arcing conventional bond wires. High aspect ratio vias 102 are also coupled to functional circuit 108 through metallization layer 110.

High aspect ratio vias 102 allow a wide range of functional circuits to be fabricated on wafer 100. For example, high aspect ratio vias 102 improve the operation of mixed mode circuits. Mixed-mode circuits include analog and digital circuitry that are formed on the same wafer or substrate. Using conventional design techniques, the switching noise caused by the digital circuits can interfere with the operation of the analog circuits. By incorporating high aspect ratio vias 102, the effect of the switching noise from the digital portion of the functional circuit on the power distribution systems can be reduced. Further, high aspect ratio vias 102 also satisfy the need for low resistance, low inductance connections to power supply, ground, clock, and guard ring busses in other circuits.

High aspect ratio vias 102 can be added to circuits using a conventional layout for the circuit without adversely affecting the surface area requirements of the circuit.

Conventional circuits typically include pads formed on the top surface of the semiconductor wafer that are used to connect to, for example, ground and power supply busses through bond wires. The bond wires of conventional circuits can be replaced by high aspect ratio vias 102 to achieve the advantages described above.

FIGS. 2, 3, 4, 5, 6, 7 and 8 are elevational views of semiconductor wafer 200 at various points of an illustrative embodiment of a method for forming an integrated circuit with high aspect ratio vias according to the teachings of the present invention. Functional circuit 202 is formed in an active region of semiconductor wafer 200. In one embodiment, semiconductor wafer 200 comprises a monocrystalline silicon wafer. For purposes of clarity, the Figures only show the formation of two high aspect ratio vias through semiconductor wafer 200. However, it is understood that with a particular functional circuit any appropriate number of vias can be formed to couple to a selected lead. For example, the number of vias needed for a conventional dynamic random access memory (DRAM) may be on the order of 100. Essentially, the vias are formed in the same space on the surface of semiconductor wafer 200 that is conventionally used to form bond pads to be connected to the same leads. The vias replace the conventional bond wires which couple the bond pads to the selected leads of a lead frame in the packaging of the semiconductor wafer.

Figure 2:
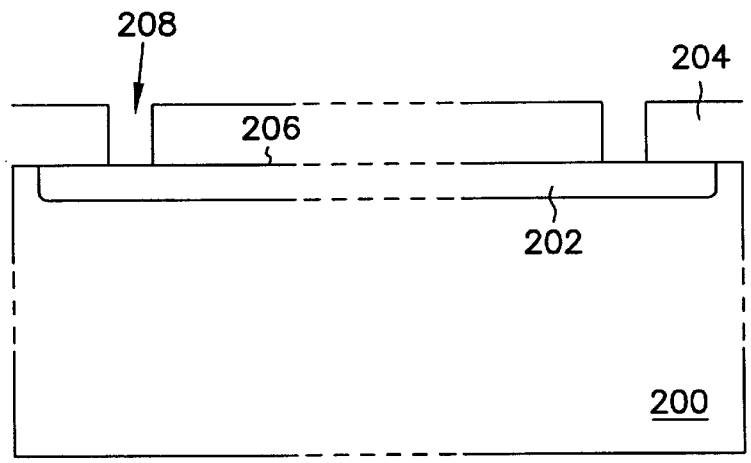
FIGS. 2, 3, 4, 5, 6, 7 and 8 are elevational views of a semiconductor wafer at various points of an illustrative embodiment of a method for forming an integrated circuit with high aspect ratio vias according to the teachings of the present invention.

As shown in FIG. 2, photo resist layer 204 is formed on surface 206 of semiconductor substrate 200. Photo resist layer 204 is patterned to provide openings 208 at points on surface 206 where high aspect ratio holes are to be formed through semiconductor wafer 200.

Figure 3:
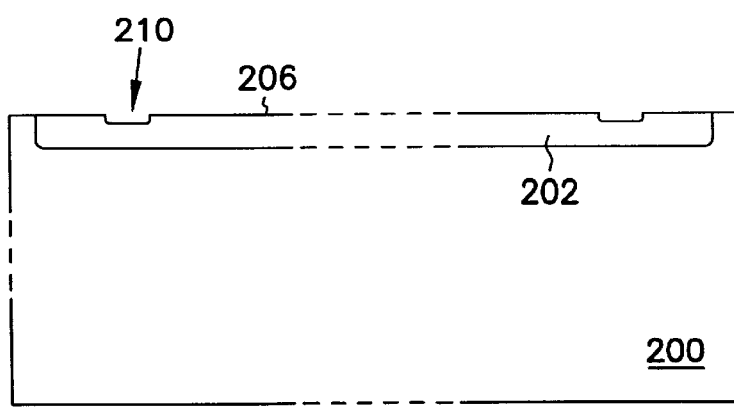

As shown in FIG. 3, etch pits 210 are formed by conventional alkaline etching through openings 208 in photo resist layer 204. Photo resist layer 204 is then removed.

Figure 4:
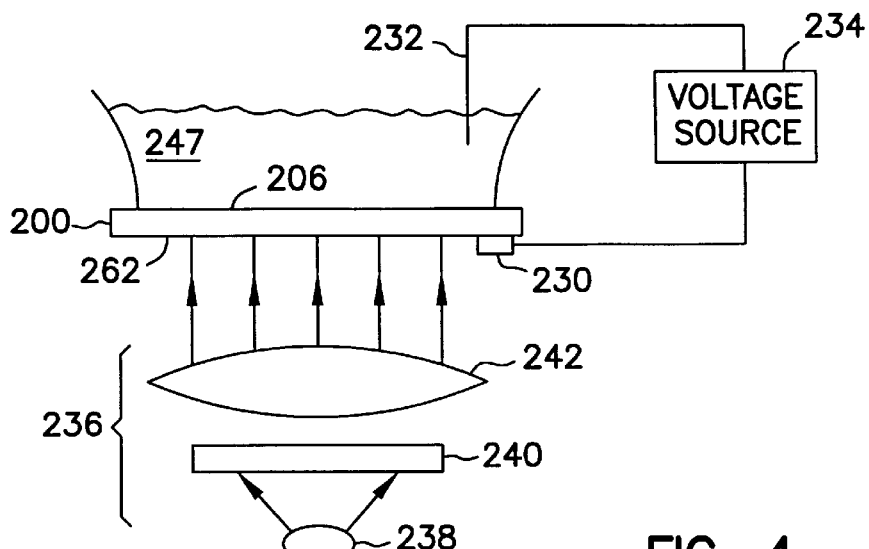
Figure 5:
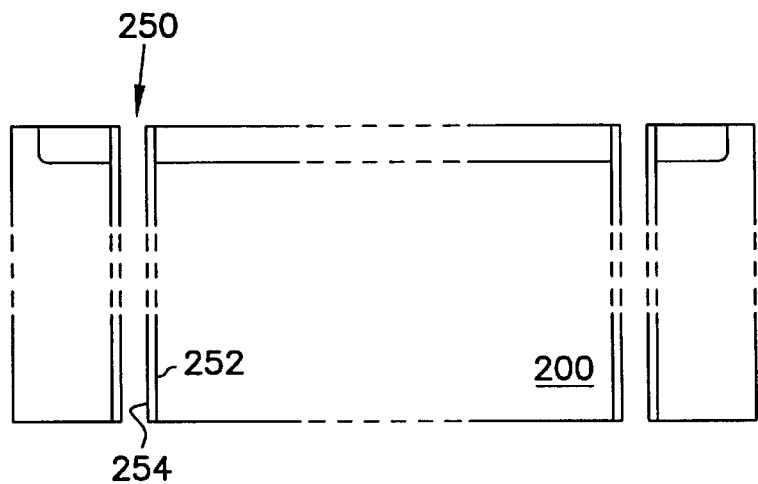

FIG. 4 is a schematic diagram that illustrates an embodiment of a layout of equipment used to carry out an anodic etch that is used to form high aspect ratio holes 250 of FIG. 5. Typically, holes 250 have an aspect ratio in the range of 100 to 200. Bottom surface 262 of semiconductor wafer 200 is coupled to voltage source 234 by positive electrode 230. Further, negative electrode 232 is coupled to voltage source 234 and is placed in a bath of 6% aqueous solution of hydrofluoric acid (HF) on surface 206 of semiconductor wafer 200.

In this example, illumination equipment 236 is also included because semiconductor wafer 200 is n-type semiconductor material. When p-type semiconductor material is used, the illumination equipment is not required. Illumination equipment 236 assures that there is a sufficient concentration of holes in semiconductor wafer 200 as required by the anodic etching process. Illumination equipment 236 includes lamp 238, IR filter 240, and lens 242. Illumination equipment 236 focuses light on surface 262 of semiconductor wafer 200.

In operation, the anodic etch etches high aspect ratio holes through semiconductor wafer 200 at the location of etch pits 210. Voltage source 234 is turned on and provides a voltage across positive and negative electrodes 230 and 232. Etching current flows from positive electrode 230 to surface 206. This current forms the high aspect ratio holes through semiconductor wafer 200. Further, illumination equipment illuminates surface 262 of semiconductor wafer 200 so as to assure a sufficient concentration of holes for the anodic etching process. The size and shape of the high aspect ratio holes through semiconductor wafer 200 depends on, for example, the anodization parameters such as HF concentration, current density, and light illumination. An anodic etching process is described in V. Lehmann, The Physics of Macropore Formation in Low Doped-Type Silicon, J. Electrochem. Soc., Vol. 140, No. 10, pp. 2836–2843, October 1993, which is incorporated herein by reference.

FIG. 5 illustrates that electrical insulation can be formed on inner surface 252 of holes 250. In this case, simple oxidation on the order of one micron or less is used to form insulator layer 254 on inner surface 252 or holes 250 to provide the electrical insulation.

Figure 6:
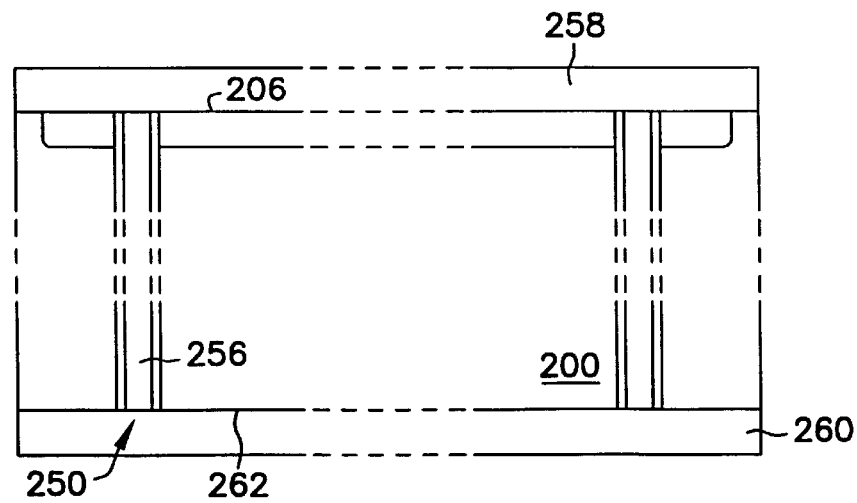
Figure 7:
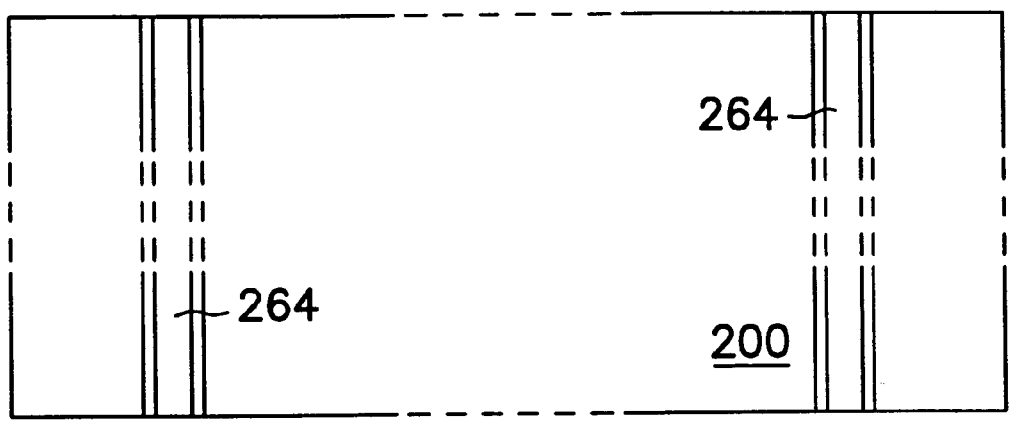

FIGS. 6 and 7 illustrate a process of aluminum/polysilicon substitution that is used to fill holes 250 with aluminum. Such a process is described in H. Horie et al., Novel High Aspect Ratio Aluminum Plug for Logic/DRAM LSIs Using Polysilicon-Aluminum Substitute, Dig. IEEE Int. Electron Device Meeting, San Francisco, pp. 946–948, 1996, which is incorporated herein by reference. First, hole 250 is filled with a layer of polysilicon 256 by a process of chemical vapor deposition (CVD). It is noted that, conventionally, such a deep trench cannot be filled directly with aluminum using a direct chemical vapor deposition technique. However, conventionally, polysilicon has been deposited in holes with such high aspect ratios, e.g., deep trenches for trench capacitors. Once the holes are filled with polysilicon, excess polysilicon on surface 206 is removed by, for example, chemical/mechanical polishing. Aluminum layers 258 and 260 are deposited on surfaces 206 and 262 using, for example, a sputtering technique used to coat optical disks. Layers 258 and 260 have a thickness on the order of a few microns. The structure shown in FIG. 6 is then annealed at 500 degrees Celsius in Nitrogen ambient. This allows the aluminum material of layers 258 and 260 to be substituted for the polysilicon in holes 250. The displaced polysilicon and any residual aluminum from layers 258 and 260 are removed by, for example, chemical/mechanical polishing. By depositing a thin, e.g, 0.1 μm, of titanium on top of layers 258 and 260 the above mentioned anneal can be reduced from 500° Celsius to 450° Celsius. The structure is now as shown in FIG. 7 with high aspect ratio vias 264 extending through semiconductor wafer 200.

Figure 8:
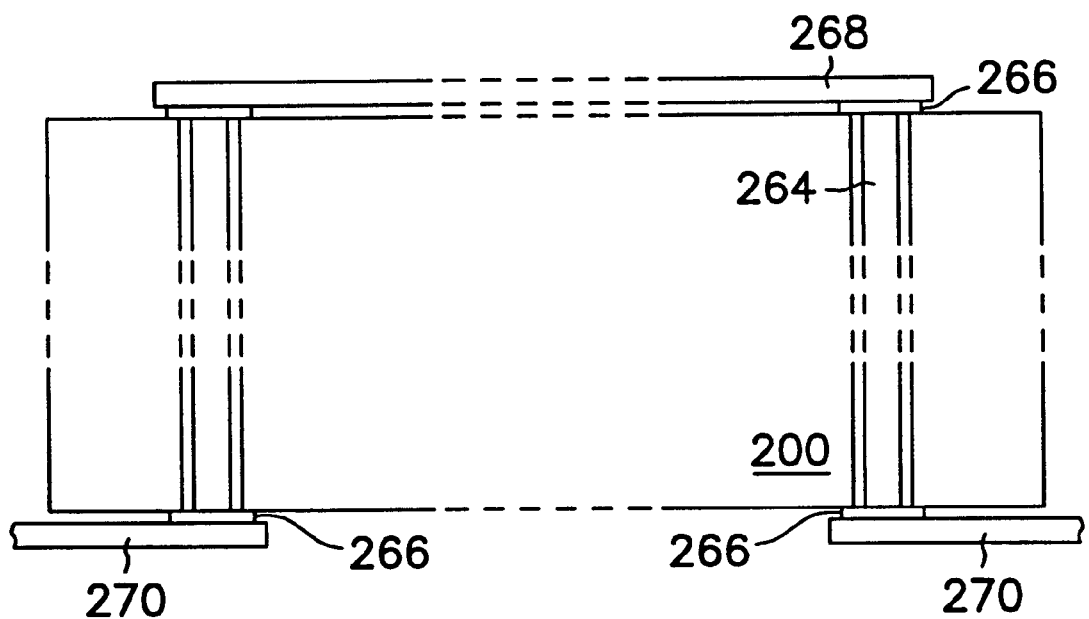

As shown in FIG. 8, in one embodiment, pads 266 are formed, using conventional techniques on both first and second surfaces 206 and 262, respectively, of semiconductor wafer 200. On first surface 206, the pads are used to connect a via to metallization layer 268. On second surface 262, the bond pads are used to connect a via to a lead 270. Thus, a voltage on lead 270 can be passed through via 264 to functional circuit 202 without problems such as ground bounce, substrate bounce, and power supply noise, and simultaneous switching noise that can be introduced using conventional bond wires. Alternatively, pads 266 can be omitted and metallization layer 268 can be brought into contact with an end of a via.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the high aspect ratio vias can be applied in a wide variety of circuits including but not limited to dynamic random access memory devices, dynamic logic circuits, and other multi-mode circuits. Further, other techniques can be used to form and fill the high aspect ratio holes to form the vias.

What is claimed is:

1. An integrated circuit, comprising:
   a semiconductor wafer having first and second surfaces;
   a functional circuit formed on the first surface of the semiconductor wafer;
   at least one high aspect ratio via that extends through the semiconductor wafer;
   wherein the at least one high aspect ratio via comprises a high aspect ratio hole that is formed by an anodic etch and that is filled by initially filling the hole with polysilicon and then substituting aluminum for polysilicon in the hole; and
   a metallization layer formed outwardly from the first surface of the semiconductor wafer that selectively couples at least one node of the functional circuit with the at least one high aspect ratio via.

2. The integrated circuit of claim 1, wherein the functional circuit includes both digital and analog integrated circuits formed on the same wafer.

3. The integrated circuit of claim 1, wherein the functional circuit includes active circuit elements.

4. The integrated circuit of claim 1, wherein the at least one high aspect ratio via comprises a low resistance connection to a ground bus.

5. The integrated circuit of claim 1, wherein the semiconductor wafer comprises a monocrystalline silicon wafer.

6. An integrated circuit, comprising:
   a semiconductor wafer having first and second surfaces;
   a functional circuit formed on the first surface of the semiconductor wafer;
   at least one high aspect ratio via that extends through the semiconductor wafer;
   a metallization layer formed outwardly from the first surface of the semiconductor wafer that selectively couples at least one node of the functional circuit with the at least one high aspect ratio via; and
   wherein the at least one high aspect ratio via comprises a via with an aspect ratio of at least 100.

7. The integrated circuit of claim 1, and further comprising a pad formed on the second side of the semiconductor wafer that couples to the at least one high aspect ratio via.

8. An integrated circuit, comprising:
a semiconductor wafer with a functional circuit formed in one surface thereof, and a number of high aspect ratio vias formed through the thickness of the wafer with a first end of each high aspect ratio via coupled to a metallization layer on the first surface of the wafer and a second end of the high aspect ratio via coupled to a bond pad on a second, opposite side of the semiconductor wafer;
wherein the at least one high aspect ratio via comprises a high aspect ratio hole that is formed by an anodic etch and that is filled by filling the hole with polysilicon and then substituting aluminum for polysilicon in the hole; and
a chip carrier having leads disposed on a surface of the chip carrier that are coupled to selected of the bond pads on the second surface of the semiconductor wafer when the semiconductor wafer is disposed on the chip carrier.

9. The integrated circuit of claim 8, wherein the functional circuit includes both digital and analog integrated circuits formed on the same wafer.

10. The integrated circuit of claim 8, wherein the at least one high aspect ratio via comprises a low resistance connection to a ground bus.

11. The integrated circuit of claim 8, wherein the semiconductor wafer comprises a monocrystalline silicon wafer.

12. An integrated circuit, comprising:
a semiconductor wafer with a functional circuit formed in one surface thereof, and a number of high aspect ratio vias formed through the thickness of the wafer with a first end of each high aspect ratio via coupled to a metallization layer on the first surface of the wafer and a second end of the high aspect ratio via coupled to a bond pad on a second, opposite side of the semiconductor wafer;
a chip carrier having leads disposed on a surface of the chip carrier that are coupled to selected of the bond pads on the second surface of the semiconductor wafer when the semiconductor wafer is disposed on the chip carrier; and
wherein the at least one high aspect ratio via comprises a via with an aspect ratio of at least 100.

13. The integrated circuit of claim 6, wherein the at least one high aspect ratio via comprises a high aspect ratio hole that is formed by an anodic etch and that is filled by substituting aluminum for polysilicon in the hole.

14. The integrated circuit of claim 6, wherein the functional circuit includes both digital and analog integrated circuits formed on the same wafer.

15. The integrated circuit of claim 6, wherein the functional circuit includes active circuit elements.

16. The integrated circuit of claim 6, wherein the at least one high aspect ratio via comprises a low resistance connection to a ground bus.

17. The integrated circuit of claim 6, wherein the semiconductor wafer comprises a monocrystalline silicon wafer.

18. The integrated circuit of claim 6, and further comprising a pad formed on the second side of the semiconductor wafer that couples to the at least one high aspect ratio via.

19. The integrated circuit of claim 12, wherein the at least one high aspect ratio via comprises a high aspect ratio hole that is formed by an anodic etch and that is filled by initially filling the hole with polysilicon and then substituting aluminum for polysilicon in the hole.

20. The integrated circuit of claim 12, wherein the functional circuit includes both digital and analog integrated circuit formed on the same wafer.

21. The integrated circuit of claim 12, wherein the at least one high aspect ratio via comprises a low resistance connection to a ground bus.

22. The integrated circuit of claim 12, wherein the semiconductor wafer comprises a monocrystalline silicon wafer.

23. An integrated circuit, comprising:
a semiconductor wafer with a functional circuit formed in one surface thereof, and a number of high aspect ratio vias formed through the thickness of the wafer with a first end of each high aspect ratio via coupled to a metallization layer on the first surface of the wafer and a second end of the high aspect ratio via coupled to a bond pad on a second, opposite side of the semiconductor wafer;
wherein the at least one high aspect ratio via comprises a high aspect ratio hole that is formed by an anodic etch and that is filled by initially filling the hole with polysilicon and then substituting aluminum for polysilicon in the hole by performing a sputtering of aluminum onto the surface of the wafer then annealing the wafer to substitute the aluminum for the polysilicon in the holes; and
a chip carrier having leads disposed on a surface of the chip carrier that are coupled to selected of the bond pads on the second surface of the semiconductor wafer when the semiconductor wafer is disposed on the chip carrier.

24. The integrated circuit of claim 23, wherein the anneal is performed at a temperature of about 500° Celsius.

25. The integrated circuit of claim 24, wherein a thin layer of titanium on the aluminum layer to reduce the anneal temperature needed to assure substitution of aluminum for the polysilicon in the holes from about 500° Celsius to below about 450° Celsius.

26. The integrated circuit of claim 12, wherein the at least one high aspect ratio via comprises a high aspect ratio hole that is formed by an anodic etch and that is filled by substituting aluminum for polysilicon in the hole by:
applying a layer of polysilicon to the surface of the wafer by chemical vapor deposition;
initially applying a coating of aluminum to the wafer by sputtering;
removing aluminum from the surface of the wafer by chemical mechanical polishing; and
annealing the wafer to substitute aluminum for the polysilicon in the holes.

* * * * *